(12) United States Patent
Erhu et al.

(10) Patent No.: US 11,211,478 B2
(45) Date of Patent: Dec. 28, 2021

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventors: Zheng Erhu, Shanghai (CN); Liu Panpan, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/993,689

(22) Filed: Aug. 14, 2020

(65) Prior Publication Data

US 2021/0273074 A1 Sep. 2, 2021

(30) Foreign Application Priority Data

Feb. 28, 2020 (CN) .......................... 202010130415.6

(51) Int. Cl.
*H01L 29/66* (2006.01)
*H01L 21/8234* (2006.01)
(Continued)

(52) U.S. Cl.
CPC ...... *H01L 29/6681* (2013.01); *H01L 21/0337* (2013.01); *H01L 21/26506* (2013.01);
(Continued)

(58) Field of Classification Search
CPC ......... H01L 21/823431; H01L 21/3086; H01L 21/322; H01L 21/26506;
(Continued)

(56) References Cited

U.S. PATENT DOCUMENTS 9,287,130 B1 * 3/2016 Cai ................... H01L 21/30604
9,564,446 B1 * 2/2017 Weybright .......... H01L 27/1104
(Continued)

FOREIGN PATENT DOCUMENTS

CN 100536092 C * 9/2009 ....... H01L 29/66795

*Primary Examiner* — Errol V Fernandes
*Assistant Examiner* — Jeremy J Joy
(74) *Attorney, Agent, or Firm* — Crowell & Moring LLP

(57) ABSTRACT

A semiconductor structure and method for forming same are provided. The forming method includes: providing a base; forming a discrete core layer on the base; forming a spacer on a sidewall of the core layer; removing the core layer; after the core layer is removed, patterning the base using the spacer as a mask to form a fin, the fin including a device fin and a dummy fin; removing the spacer; performing doping removal on the dummy fin one or more times to remove the dummy fin, the step of the doping removal including: performing ion doping on the entire dummy fin or a part of the dummy fin in thickness for improving an etching selection ratio of the dummy fin to the device fin; and removing the ion-doped dummy fin. Embodiments and implementations of the present disclosure help increase a process window of a fin cut process.

13 Claims, 7 Drawing Sheets

(51) Int. Cl.
*H01L 21/308* (2006.01)
*H01L 21/265* (2006.01)
*H01L 21/033* (2006.01)
*H01L 21/322* (2006.01)
*H01L 29/78* (2006.01)
*H01L 21/467* (2006.01)

(52) U.S. Cl.
CPC ........ *H01L 21/3086* (2013.01); *H01L 21/322* (2013.01); *H01L 21/467* (2013.01); *H01L 21/823431* (2013.01); *H01L 21/823468* (2013.01); *H01L 29/66803* (2013.01); *H01L 29/7856* (2013.01)

(58) Field of Classification Search
CPC . H01L 29/785–7851; H01L 29/66795–66803; H01L 29/6681; H01L 27/0886; H01L 27/1211
See application file for complete search history.

(56) References Cited

U.S. PATENT DOCUMENTS

| | | | |
|---|---|---|---|
| 2011/0147842 A1* | 6/2011 | Cappellani | H01L 21/26506 257/365 |
| 2014/0145248 A1* | 5/2014 | Cheng | H01L 21/02164 257/288 |
| 2015/0311085 A1* | 10/2015 | Kozarsky | H01L 21/3086 257/401 |
| 2015/0380526 A1* | 12/2015 | Godet | H01L 21/3065 438/482 |
| 2016/0315147 A1* | 10/2016 | Leobandung | H01L 21/823431 |
| 2017/0154776 A1* | 6/2017 | Godet | H01L 21/823821 |
| 2018/0019317 A1* | 1/2018 | Cheng | H01L 21/02236 |
| 2018/0226403 A1* | 8/2018 | Chen | H01L 27/0886 |
| 2019/0378763 A1* | 12/2019 | Wang | H01L 21/823431 |
| 2020/0294810 A1* | 9/2020 | Jin | H01L 21/0214 |

* cited by examiner

SEMICONDUCTOR STRUCTURE AND METHOD FOR FORMING SAME

RELATED APPLICATIONS

The present application claims priority to Chinese Patent Appln. No. 202010130415.6, filed on Feb. 28, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

In semiconductor manufacturing, with the development trend of large-scale integrated circuits, integrated circuits have an increasingly small critical dimension. In order to adapt to a smaller critical dimension, a channel length of a metal-oxide-semiconductor field-effect transistor (MOSFET) is also increasingly small. However, as a channel length of a device becomes smaller, a distance between a source and a drain of the device decreases accordingly. Therefore, a channel control capability of a gate structure deteriorates, and there is increasing difficulty in pinching the channel off by a gate voltage, resulting in a higher possibility of subthreshold leakage, that is, the so-called short-channel effect (SCE).

In order to reduce the impact of the short-channel effect, the semiconductor process gradually transitions from a planar MOSFET to a three-dimensional (3D) transistor with higher efficacy, such as a fin field effect transistor (FinFET). In the FinFET, a gate structure may control an ultra-thin body (a fin) from at least two sides. Compared to the planar MOSFET, the gate structure has a stronger channel control capability and can suppress the short-channel effect well. In addition, the FinFET has better compatibility with current integrated circuit manufacturing compared to other devices.

In the semiconductor field, fins with different pitches usually need to be formed according to process requirements. Currently, the fins with different pitches are formed through fin cut processes, which generally include a fin cut first process and a fin cut last process.

SUMMARY

To address the problems described above, embodiments and implementations of the present disclosure provide a semiconductor structure and a method for forming same, to enlarge a process window of a fin cut process.

One form of the present disclosure provides a method for forming a semiconductor structure, including: providing a base; forming a discrete core layer on the base; forming a spacer on a sidewall of the core layer; removing the core layer; and after the core layer is removed, patterning the base using the spacer as a mask.

The method may further include forming a fin, where the fin includes a device fin and a dummy fin; removing the spacer; and performing doping removal on the dummy fin one or more times to remove the dummy fin, where the step of the doping removal includes: performing ion doping on the entire dummy fin or a part of the dummy fin in thickness for improving an etching selection ratio of the dummy fin to the device fin; and removing the ion-doped dummy fin.

Another form of the present disclosure further provides a semiconductor structure, including: a substrate; discrete fins located on the substrate and comprising a device fin and a dummy fin, wherein the dummy fin has a doped ion therein, the doped ion being suitable for improving an etching selection ratio of the dummy fin to the device fin.

Compared to the prior art, technical solutions of the embodiments and implementations of the present disclosure have the following advantages.

In forms of the method for forming a semiconductor structure provided in some implementations of the present disclosure, doping removal is performed on the dummy fin one or more times to remove the dummy fin, the doping removal including: performing ion doping on the entire dummy fin or a part of the dummy fin in thickness for improving an etching selection ratio of the dummy fin to the device fin; and removing the ion-doped fin. Therefore, during removal of the dummy fin, an etching selection ratio of the dummy fin to the device fin is relatively large, helping reduce a probability of mis-etching the device fin, and helping increase a process window of the fin cut process, thereby improving performance of the semiconductor structure.

In some optional solutions, the spacer is used as a mask for patterning the base to form the fin, and a position of the spacer is in a one-to-one correspondence with a position of the fin, where a spacer for forming the device fin is a mask spacer, and a spacer for forming the dummy fin is a dummy mask spacer, where the dummy mask spacer includes a first dummy spacer consisting of a plurality of adjacent spacers and a second dummy spacer consisting of a single spacer.

In some implementations of the present disclosure, after the core layer is removed and before the base is patterned, the method further includes: removing the second dummy spacer. The second dummy spacer consists of a single spacer. Removing the second dummy spacer before the base is patterned helps reduce impact on pitch consistency between remaining spacers. Correspondingly, during patterning of the base using the spacer as a mask to form the fin, the fin has relatively high dimension uniformity and cross-sectional profile uniformity. In addition, a height of the spacer is less than a height of the fin. Removing the second dummy spacer before the base is patterned further helps reduce difficulty in removing the second dummy spacer, thereby increasing the process window of the fin cut process.

DETAILED DESCRIPTION

A current fin cut process has a relatively small process window. Reasons are analyzed with reference to two methods for forming a semiconductor structure.

A fin cut last process is taken as an example. FIG. 1 to FIG. 7 show structural schematic diagrams corresponding to steps in a method for forming a semiconductor structure.

Figure 1:
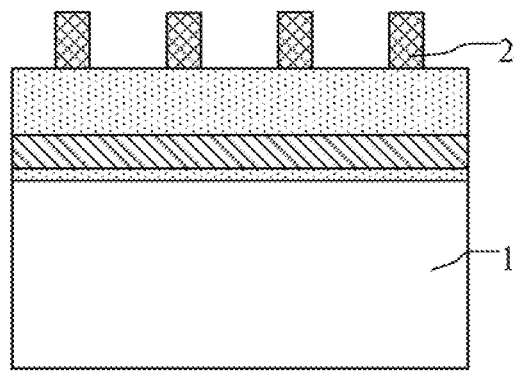
FIG. 1 to FIG. 7 are schematic structural diagrams corresponding to steps in a method for forming a semiconductor structure.

Referring to FIG. 1, a base 1 is provided. A discrete core layer 2 is formed on the base 1.

Figure 2:
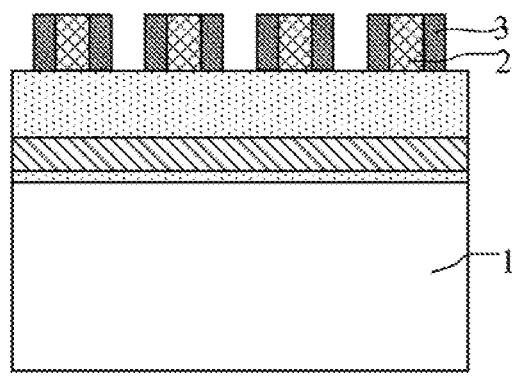

Referring to FIG. 2, a spacer 3 is formed on the sidewall of the core layer 2.

Figure 3:
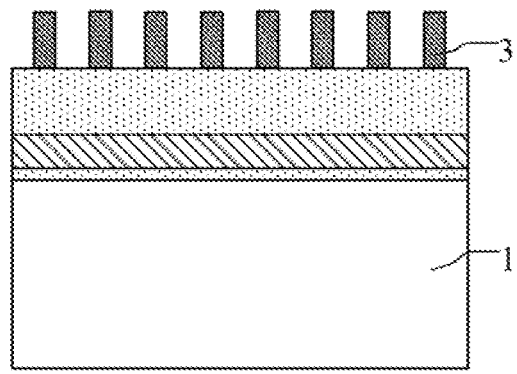

Referring to FIG. 3, the core layer 2 is removed.

Figure 4:
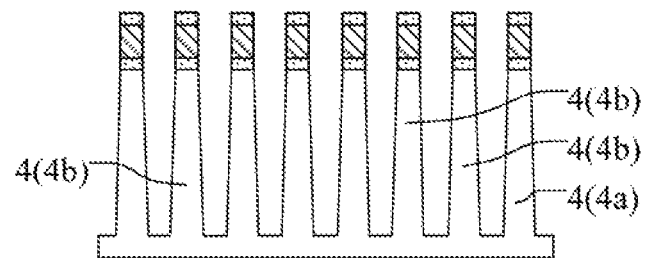

Referring to FIG. 4, after the core layer 2 is removed, the base 1 is patterned using the spacer 3 as a mask to form a fin 4. Fin 4 includes a device fin 4a and a dummy fin 4b. The spacer 3 is removed.

Figure 5:
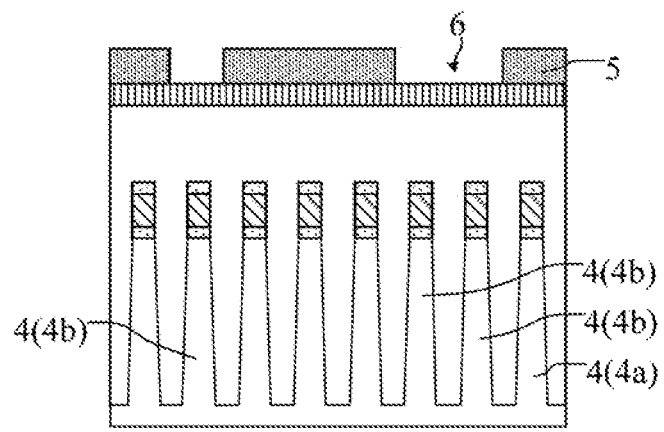
Figure 6:
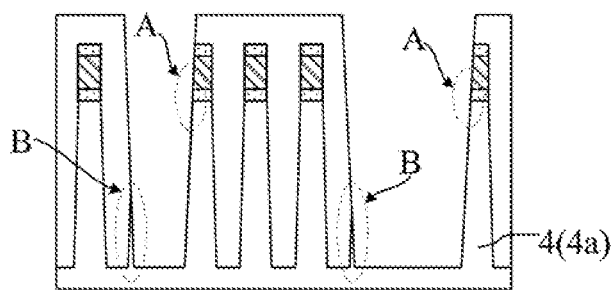
Figure 7:
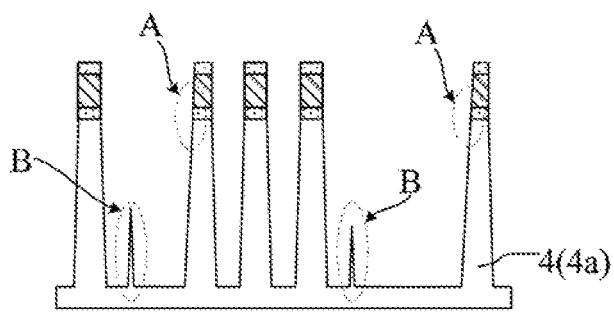

Referring to FIG. 5-FIG. 7, the dummy fin 4b is removed. The step of removing the dummy fin 4b includes: forming a pattern layer 5 on the base 1, the pattern layer 5 covering the device fin 4a and having an opening 6 located above the dummy fin 4b and corresponding to a position of the dummy fin 4b; removing the dummy fin 4b using the pattern layer 5 as a mask; and removing the pattern layer 5.

In the above forming method, after the fin 4 is formed, the dummy fin 4b is removed. The device fin 4a has relatively good dimension consistency. However, the fin 4 generally has a larger height compared to the spacer 3. During removal of the dummy fin 4b, the dummy fin 4b is etched for a relatively long time, and a process for removing the dummy fin 4b is likely to cause damage to the device fin 4a adjacent to the dummy fin 4b. Especially when there is an overlay shift during formation of the pattern layer 5, there is a relatively high probability that the process for removing the dummy fin 4b causes damage to the device fin 4a adjacent to the dummy fin 4b (shown by an arrow A in FIG. 6). In addition, the dummy fin 4b remains (shown by an arrow B in FIG. 6), which is likely to reduce a process window of a photolithography process for forming the pattern layer 5, resulting in a smaller process window of the fin cut process.

Another method is a fin cut last process. FIG. 8 to FIG. 12 show structural schematic diagrams corresponding to steps in another method for forming a semiconductor structure.

Figure 8:
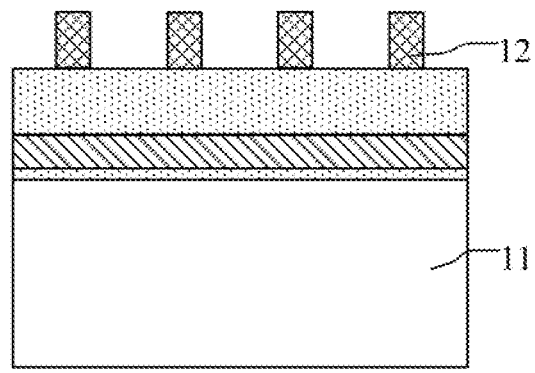
FIG. 8 to FIG. 12 are schematic structural diagrams showing corresponding steps in another method for forming a semiconductor structure.

Referring to FIG. 8, a base 11 is provided. A discrete core layer 12 is formed on the base 11.

Figure 9:
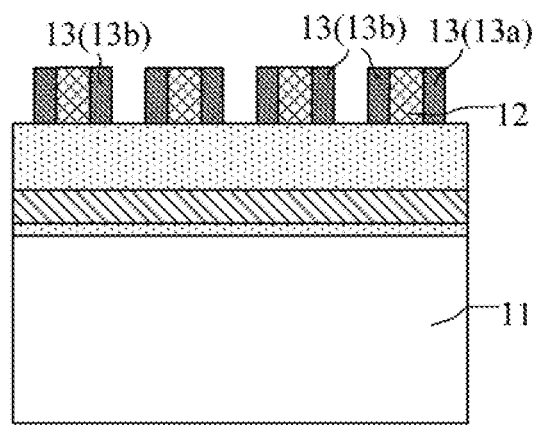

Referring to FIG. 9, a spacer 13 is formed on a sidewall of the core layer 12. The spacer 13 is used as a mask for patterning the base 11 to form the fin. The spacers 13 are in a one-to-one correspondence with positions of the fins. The spacer 13 includes a discrete mask spacer 13a and a dummy spacer 13b.

Figure 10:
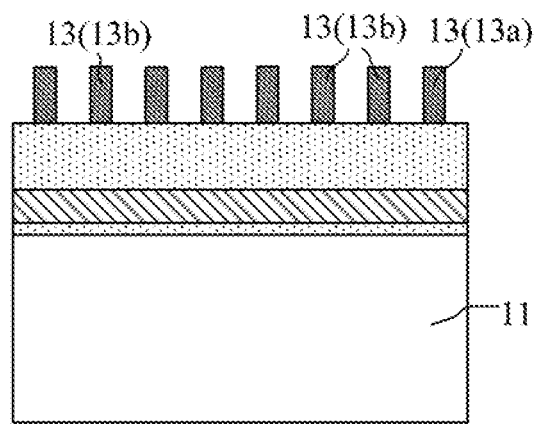

Referring to FIG. 10, the core layer 12 is removed.

Figure 11:
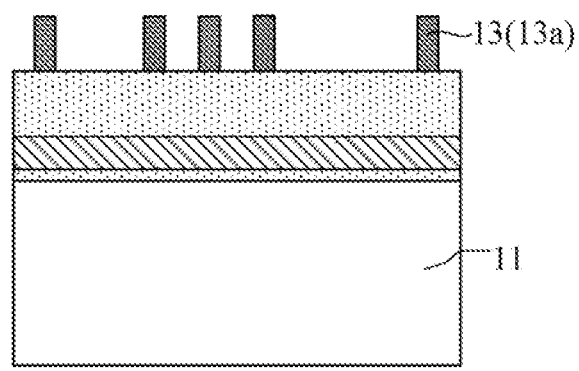

Referring to FIG. 11, after the core layer 12 is removed, the dummy spacer 13b is removed.

Figure 12:
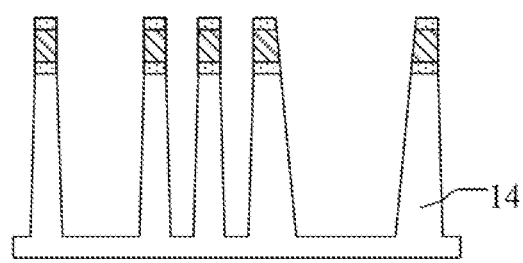

Referring to FIG. 12, after the dummy spacer 13b is removed, the mask spacer 13a is used as a mask to pattern the base 11 to form a device fin 14.

In the above forming method, compared to the fin cut last process, since the height of the spacer 13 is less than that of the device fin 14, the dummy spacer 13b is correspondingly etched for a relatively short time during removal of the dummy spacer 13b, helping to reduce a probability of causing damage to the adjacent mask spacer 13a during removal of the dummy spacer 13b.

However, in forms of the forming method, the mask spacer 13a is used as a mask to pattern the base 11 to form the device fin 14 after the dummy spacer 13b is removed, after the dummy spacer 13b is removed, openings between the mask spacers 13a have different dimensions, and pitch uniformity between the mask spacers 13a is relatively poor. As a result, during patterning of the base 11 using the mask spacer 13a as a mask, bases 11 in different regions are likely to be etched at different rates, which is likely to result in relatively poor width uniformity and cross-sectional profile uniformity of the device fin 14.

To address the technical problem, in forms of the method for forming a semiconductor structure provided the present disclosure, doping removal is performed on the dummy fin one or more times to remove the dummy fin. The doping removal includes: performing ion doping on the entire dummy fin or a part of the dummy fin in thickness for improving an etching selection ratio of the dummy fin to the device fin; and removing the ion-doped fin. Therefore, during removal of the dummy fin, an etching selection ratio of the dummy fin to the device fin is relatively large, helping reduce a probability of mis-etching the device fin, and helping increase a process window of the fin cut process, thereby improving performance of the semiconductor structure.

In order to make the foregoing objectives, features, and advantages of embodiments and implementations of the present disclosure more apparent and easier to understand, embodiments and implementations of the present disclosure are described in detail below with reference to the drawings.

FIG. 13 to FIG. 23 are schematic structural diagrams corresponding to steps in one form of a method for forming a semiconductor structure according to the present disclosure.

Figure 13:
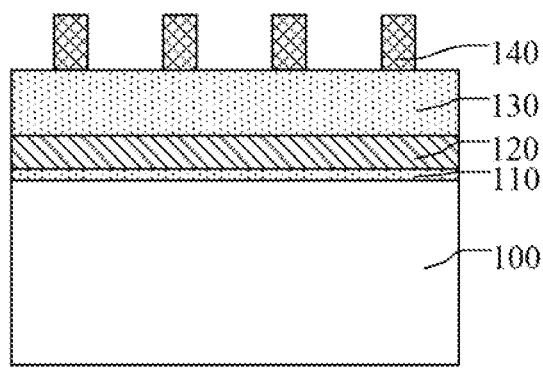
FIG. 13 to FIG. 23 are schematic structural diagrams corresponding to steps in one form of a method for forming a semiconductor structure according to the present disclosure.

Referring to FIG. 13, a base 100 is provided.

The base 100 provides a process platform for a subsequent process. The base 100 is also used as a to-be-etched material layer in a patterning process. In some implementations, the base 100 is configured to form a substrate and a fin located protruding from the substrate.

In some implementations, the base 100 is made of silicon. In some other implementations, the base may also be made of other materials such as germanium, silicon germanide, silicon carbide, gallium arsenide, indium gallide, or the like. The base may also be other types of bases such as a silicon base on an insulator or a germanium base on an insulator. In still some other implementations, the base may further include a first semiconductor layer and a second semiconductor layer epitaxially growing on the first semiconductor layer. The first semiconductor layer is configured to provide a process basis for subsequently forming the substrate, and the second semiconductor layer is configured to provide a process basis for subsequently forming the fin.

In other implementations, the substrate may be other functional layers to be etched, for example, a gate material layer.

In some implementations, after the base 100 is provided, the method for forming a semiconductor structure further includes: forming a pad oxide layer 110 on the base 100; forming a polishing stop layer 120 on the pad oxide layer 110; and forming a hard mask material layer 130 is formed on the polishing stop layer 120.

The pad oxide layer 110 is configured to provide a buffering effect during forming of the polishing stop layer 120, helping avoid malposition during direct forming of the polishing stop layer 120 on the base 100. In some implementations, the pad oxide layer 110 is made of silicon oxide.

After subsequent patterning of the base 100 to form the substrate and the fin protruding from the substrate, the method usually further includes a step of forming an isolation structure on the substrate exposed from the fin. A process for forming the isolation structure usually includes a polishing process, and the polishing stop layer 120 is configured to define a position at which the polishing process is stopped.

In some implementations, the polishing stop layer 120 is made of silicon nitride.

The hard mask material layer 130 is configured to form a hard mask layer after a subsequent etching process. After the spacer is subsequently formed, a pattern of the spacer is first transferred to the hard mask material layer 130. Even if the spacer has a loss during patterning of the base 100, the hard mask layer may still be used as a mask to etch the base 100, helping improve process stability and a process effect of subsequent patterning of the base 100.

In addition, a subsequent process of forming a discrete core layer on the base 100 and forming a spacer generally includes a combination of deposition and etching processes. The top surface of the hard mask material layer 130 is further configured to define a position at which an etching process is stopped, so as to avoid over-etching, thereby reducing a risk of causing damage to the base 100.

In some implementations, the hard mask material layer 130 is made of silicon oxide. In some implementations, according to materials of the base and the subsequent spacer, the hard mask material layer may be made of other suitable materials such as silicon nitride, silicon oxynitride, silicon oxycarbonitride, or silicon.

Still referring to FIG. 13, a discrete core layer 140 is formed on the base 100.

A subsequent step further includes: forming a spacer on a sidewall of the core layer 140, the core layer 140 being configured to provide support for forming the spacer. The core layer 140 is subsequently removed. Therefore, the core layer 140 is made of a material that may be easily removed, and the process for removing the core layer 140 causes little damage to other film layers, thereby reducing difficulty in subsequently removing the core layer 140. The core layer 140 is made of a material including amorphous silicon, silicon nitride, silicon oxide, amorphous carbon, and photoresist, etc. In some implementations, the core layer 140 may be made of amorphous silicon.

In some implementations, the step of forming the core layer 140 includes: forming core material layer (not shown) on the base 100 and patterning the core material layer, a remaining core material layer being used as the core layer 140.

Figure 14:
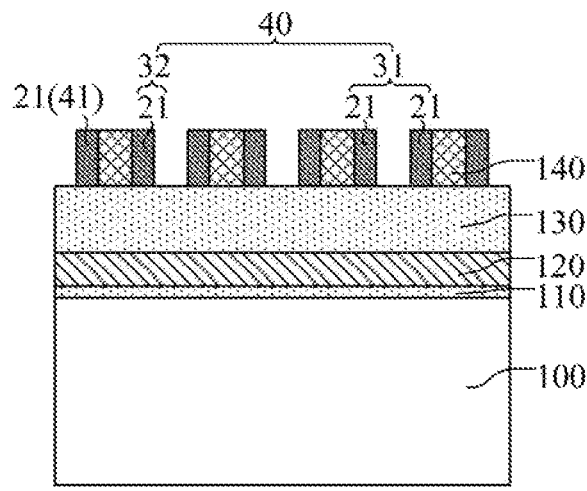

Referring to FIG. 14, a spacer 21 is formed on a sidewall of the core layer 140.

The spacer 21 is used as a mask for subsequently patterning the base 100 to form the fin. The spacers 21 are in a one-to-one correspondence with positions of the fins. The fin subsequently formed through patterning of the base 100 includes a device fin and a dummy fin.

In some implementations, the spacer 21 for forming the device fin is a mask spacer 41, and the spacer 21 for forming the dummy fin is a dummy mask spacer 40. The dummy mask spacer 40 includes a first dummy spacer 31 consisting of a plurality of adjacent spacers 21 and a second dummy spacer 32 consisting of a single spacer 21.

In some implementations, that the first dummy spacer 31 includes two adjacent spacers 21 is used as an example. In other implementations, the first dummy spacer may include more than two spacers. No limitation is imposed herein in the present disclosure.

The spacer 21 is made of a material including silicon oxide, silicon nitride, silicon oxynitride, silicon, or silicon oxide. In some implementations, the spacer 21 is made of silicon nitride.

In some implementations, the step of forming the spacer 21 includes: forming a spacer film (not shown) on the top and the sidewall of the core layer 140 and on the base 100 between the core layers 140, and removing the spacer film located on the top of the core layer 140 and on the base 100 between the core layers 140. A remaining spacer film located on the sidewall of the core layer 140 serves as the spacer 21.

In some implementations, the spacer film is formed using an atom layer deposition process.

In some implementations, a drying etching process is used. For example, the spacer film located on the top of the core layer 140 and on the base 100 between the core layers 140 is removed using an anisotropic dry etching process.

Figure 15:
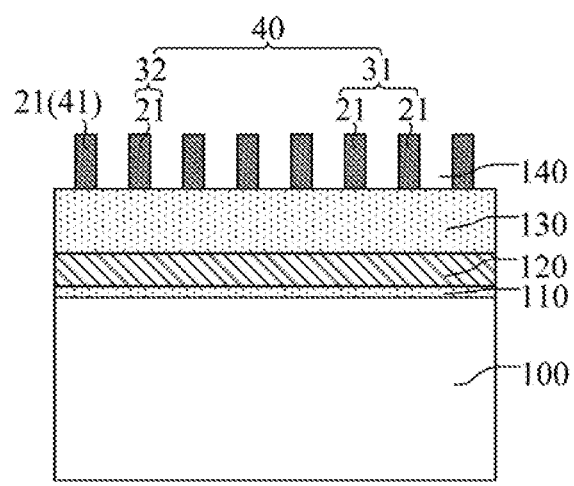

Referring to FIG. 15, the core layer 140 is removed (shown in FIG. 14). The core layer 140 is removed to expose the base 100 at the bottom of the core layer 140 to prepare for subsequent patterning of the base 100.

In some implementations, the core layer 140 is removed using a wet etching process. Specifically, the core layer 140 is made of amorphous silicon, and an etching solution used in the wet etching process is a mixed solution of and HBr or a TMAH solution. In other implementations, the core layer may be removed using a dry etching process, or a combination of a dry etching process and a wet etching process.

A subsequent step further includes: patterning the base 100 using the spacer 21 as a mask.

Figure 16:
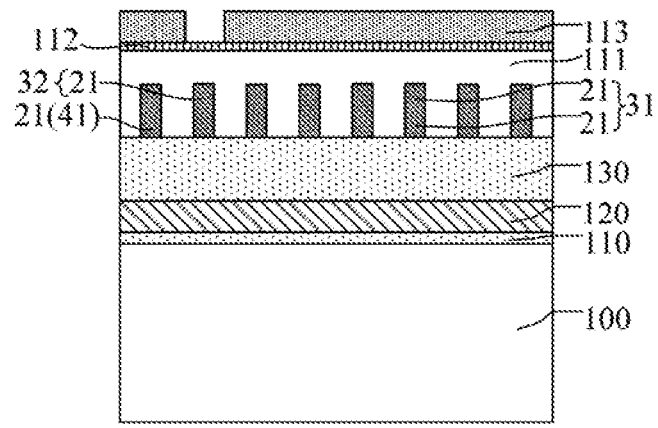
Figure 17:
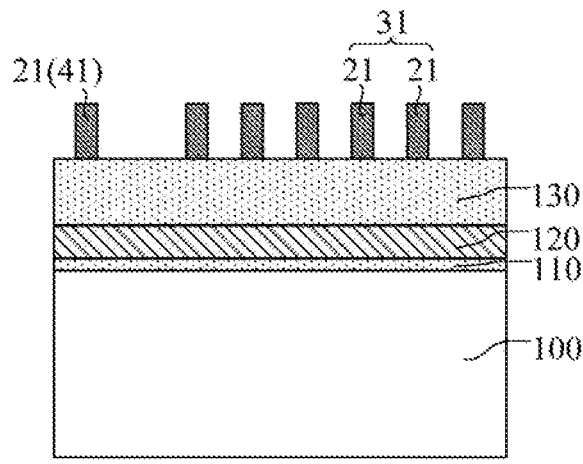

With reference to FIG. 16 to FIG. 17, in some implementations, after the core layer 140 is removed and before the base 100 is patterned, the method for forming a semiconductor structure further includes: removing the second dummy spacer 32 (shown in FIG. 16).

In some implementations, the second dummy spacer 32 consists of a single spacer 21. Compared to the solution of removing the first dummy spacer before the base the patterned, removing the second dummy spacer 32 before the base 100 is patterned helps reduce impact on pitch consistency between remaining spacers 21.

Correspondingly, during patterning of the base 100 using the spacer 21 as a mask to form the fin, the fin has relatively high dimension uniformity and cross-sectional profile uniformity. In addition, a height of the spacer 21 is less than a height of the fin. Therefore, compared to a solution of removing a single fin, removing a single spacer 21 is less difficult. Removing the second dummy spacer 32 is removed before the base 100 is patterned further helps reduce difficulty in removing the second dummy spacer 32, thereby increasing the process window of the fin cut process.

Specifically, the height of the spacer 21 is relatively small. During removal of the second dummy spacer 32 using an etching process, the second dummy spacer 32 is etched for a relatively short time, helping reduce a risk of mis-etching the spacer 21 adjacent to the second dummy spacer 32.

Specifically, the step of removing the second dummy spacer 32 includes the following.

As shown in FIG. 16, a filling layer 111 covering the spacer 21 is formed on the base 100; and a first anti-reflection coating layer 112 is formed on the filling layer 111. A first pattern layer 113 is formed on the first anti-reflection coating layer 112, the first anti-reflection coating layer 111 located on the second dummy spacer 32 being exposed from the first pattern layer 113.

The first pattern layer 113 is used as a mask for etching the filling layer 111 and the second dummy spacer 32.

In some implementations, the first pattern layer 113 is made of photoresist, and the first pattern layer 113 may be formed using a photolithography process such as spin coating, exposure, and development, etc.

The filling layer 111 is configured to provide a flat surface for forming the first anti-reflection coating layer 112 and the first pattern layer 113, thereby helping improve accuracy of pattern transfer. In some implementations, the filling layer 111 is made of a spin on carbon (SOC) material. The SOC material costs low, a forming process is simple, process compatibility is high, and filling performance of the SOC material is relatively good.

The first anti-reflection coating layer 112 is configured to reduce a reflection effect during exposure, thereby improving pattern transfer precision. In some implementations, the first anti-reflection coating layer 112 is an Si-ARC layer (an Si-based anti-reflection coating). The Si-ARC layer helps improve exposure uniformity, thereby helping further improve the pattern transfer precision.

As shown in FIG. 17, the first anti-reflection coating layer 112, the filling layer 111, and the second dummy spacer 32 are sequentially etched using the first pattern layer 113 as a mask.

In some implementations, a drying etching process is used. For example, the first anti-reflection coating (ARC) layer 112, the filling layer 111, and second dummy spacer 32 are sequentially etched using an anisotropic dry etching process. The anisotropic dry etching process has an anisotropic etching characteristic, helping reduce a probability of lateral etching, thereby reducing a risk of causing damage to adjacent spacer 21. Moreover, the dry etching process helps to achieve a relatively high etching selection ratio.

In some implementations, during removal of the second dummy spacer 32, an etching selection ratio of the second dummy spacer 32 to the hard mask material layer 130 in the dry etching process is at least 5:1.

In some implementations, during removal of the second dummy spacer 32, an etching gas of the dry etching process includes a main etching gas and an auxiliary etching gas. The main etching gas includes at least one of $C_xF_y$, $C_xH_yF_z$, and $C_xH_y$, and the auxiliary etching gas includes at least one of $H_2$, $O_2$, $SO_2$, He, and Ar. Where, x, y, and z are all positive integers.

In some implementations, during removal of the second dummy spacer 32, the first pattern layer 113 and the first anti-reflection coating layer 112 are gradually consumed. After the second dummy spacer 32 is removed, the first pattern layer 113 and the first anti-reflection coating 112 are already removed. Therefore, after the second dummy spacer 32 is removed, the method for forming a semiconductor structure further includes: removing the filling layer 111. Specifically, the filling layer 111 may be removed using an ashing process.

Figure 18:
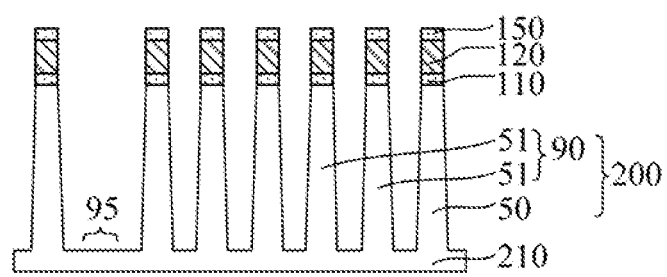

Referring to FIG. 18, after the core layer 140 (shown in FIG. 14) is removed, the spacer 21 is used as a mask to pattern the base 100 to form a fin 200. The fin 200 includes a device fin 50 and a dummy fin 51.

In some implementations, before the base 100 is patterned, only the second dummy spacer 32 consisting of a single spacer 21 is removed. Removing the second dummy spacer 32 has relatively little impact on pitch consistency between the spacers 21. During patterning of the base 100, the fin 200 also has relatively high dimension consistency and cross-sectional profile consistency.

In some implementations, the spacer 21 is used as a mask to pattern the base 100 to form a substrate 210 and a fin 200 protruding from the substrate 210.

In some implementations, the fin 200 and the substrate 210 are an integrated structure. In other implementations, when the base includes a first semiconductor layer and a second semiconductor layer epitaxially growing on the first semiconductor layer, in the step of etching the base, only the second semiconductor layer is etched, the first semiconductor layer is used as a substrate, and a remaining second semiconductor layer protruding from the first semiconductor layer is used as a fin. Correspondingly, the fin and the substrate may also be made of different materials.

The dummy fin 51 is a to-be-removed fin 200, and the dummy fin 51 corresponds to a fin cut position.

In some implementations, during patterning of the base 100, the base 100 is patterned using the spacer 21 as a mask. The device fin 50 is formed at a position corresponding to a position of the mask spacer 40, and the dummy fin 51 is formed at a position corresponding to a position of the first dummy spacer 31.

In some implementations, the first dummy spacer 31 consists of a plurality of adjacent spacers 21. Therefore, after the dummy fin 51 is formed at the position corresponding to the position of the first dummy spacer 31, there are a plurality of dummy fins 51. The plurality of dummy fins 51 are adjacent to each other to form a dummy fin set 90.

Accordingly, in some implementations, the dummy fin set 90 has two adjacent dummy fins 51. In other implementations, according to a number of spacers in the first dummy spacer, there may be more than two dummy fins in the dummy fin set.

In some implementations, before the base 100 is patterned, the second dummy spacer 32 consisting of a single spacer 21 is further removed. Therefore, after the substrate 210 and the fin 200 protruding from the substrate 210 are formed, the substrate 210 further includes an interval 95 isolated from the dummy fin set 90 and corresponding to a single fin cut position. In other words, there is also an interval 95 corresponding to a single fin cut position between two device fins 50 on two sides of the interval 95. Accordingly, the interval 95 corresponds to the position of the second dummy spacer 32.

In some implementations, the step of patterning the base 100 includes: sequentially etching the hard mask material layer 130 (shown in FIG. 17), the polishing stop layer 120, and the pad oxide layer 110 using the spacer 21 as a mask.

During patterning of the base 100, the hard mask material layer 130 is patterned using the spacer 21 as a mask to form a hard mask layer 150. Therefore, in some implementations, during patterning of the base 100 to form the fin 200, a hard mask layer 150 is further formed on the top of the fin 200.

In some implementations, a drying etching process is used. For example, the base 100 is patterned using an anisotropic dry etching process. Specifically, in some implementations, an etching gas of the dry etching process includes a main etching gas and an auxiliary etching gas. The main etching gas includes at least one of $C_xF_y$, $C_xH_yF_z$, and $C_xH_y$, and the auxiliary etching gas includes at least one of $H_2$, $Cl_2$, HBr, Ar, and He.

Still referring to FIG. 18, the spacer 21 is removed.

In some implementations, during patterning of the base 100, the spacer 21 is gradually consumed. Therefore, after the base 100 is patterned to form the fin 200, the spacer 21 is already removed.

In other implementations, after the base is patterned to form the fin, when a part of the spacer still remains on the fin, the remaining spacer may be correspondingly removed using an etching process.

Referring to FIG. 19 to FIG. 23, doping removal is performed on the dummy fin 51 one or more times to remove the dummy fin 51. The step of the doping removal includes: performing ion doping 80 (shown in FIG. 21) on the entire dummy fin 51 or a part of the dummy fin 51 in thickness for improving an etching selection ratio of the dummy fin 51 to the device fin 50; and removing the ion-doped dummy fin 51.

The dummy fin 51 is removed, so that there are different pitch types between the device fins 50.

In some implementations of the present disclosure, doping removal is performed on the dummy fin 51 one or more times to remove the dummy fin 51. The doping removal includes: performing ion doping on the entire dummy fin 51 or a part of the dummy fin 51 in thickness for improving an etching selection ratio of the dummy fin 51 to the device fin 50; removing the ion-doped fin 51. Therefore, during removal of the dummy fin 51, the etching selection ratio of the dummy fin 51 to the device fin 50 is relatively large, helping reduce a probability of mis-etching the device fin 50 and increasing a process window of the fin cut process, thereby improving performance of the semiconductor structure.

In some implementations, the dummy fin 51 is made of amorphous silicon. In the step of performing ion doping 80 on the entire dummy fin 51 or a part of the dummy fin 51 in thickness, a doped ion includes an argon ion, a boron ion, or an arsenic ion.

Doping the argon ion into the dummy fin 51 helps increase a roughness and a porosity of the material of the ion-doped dummy fin 51, so that a density and a hardness of the material of the dummy fin 51 are reduced. Therefore, the dummy fin 51 doped with the argon ion is more easily removed, thereby correspondingly improving the etching selection ratio of the dummy fin 51 to the device fin 50.

Compared to silicon, boron or arsenic has a smaller atomic radius. Doping the boron ion or the arsenic ion into the dummy fin 51 can generate a tensile stress in a lattice structure of silicon, forming malposition in the material of the dummy fin 51, so that the ion-doped dummy fin 51 is more easily removed, thereby improving the etching selection ratio of the dummy fin 51 to the device fin 50 correspondingly.

In some implementations, other appropriate ions may be selected for performing ion doping on the entire dummy fin or a part of the dummy fin in thickness to improve the etching selection ratio of the dummy fin to the device fin. No limitation is imposed on this in the present disclosure.

In an example, in some implementations, the step of removing the dummy fin 51 includes performing doping removal once. In some implementations, the step of removing the dummy fin may further include performing doping removal a plurality of times.

The steps of the doping removal in some implementations are described in detail below with reference to the drawings.

Figure 19:
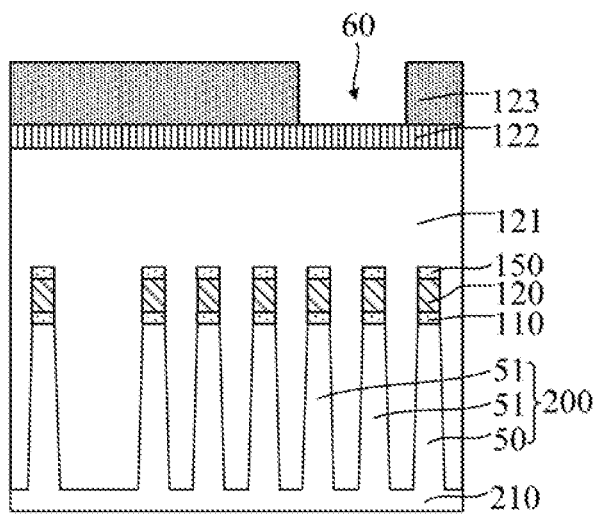
Figure 20:
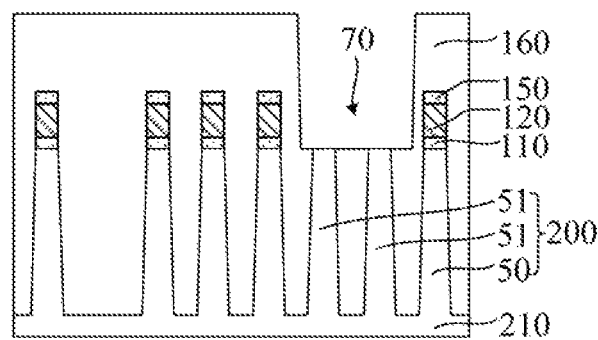
Figure 21:
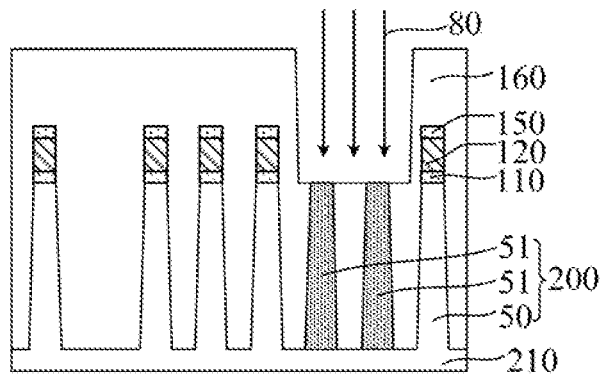

As shown in FIG. 19 to FIG. 21, ion doping 80 is performed on the entire dummy fin 51 or a part of the dummy fin 51 in thickness. Performing ion doping 80 improves the etching selection ratio of the dummy fin 51 to the device fin 50, thereby increasing a process window for subsequently removing the dummy fin 51 and reducing a probability of mis-etching the device fin 50 in the process for removing the dummy fin 51.

In some implementations, ion doping is performed on a dummy fin set 90 consisting of a plurality of adjacent dummy fins 51. Compared to ion doping 80 on a single dummy fin 51, the plurality of dummy fins 51 in the dummy fin set 90 occupy a larger area, helping reduce difficulty of ion doping 80 on the dummy fin 51 and helping reduce a probability of doping ions into an adjacent device fin 50.

In some implementations, the step of removing the dummy fin 51 includes performing doping removal once. Accordingly, ion doping 80 is performed on the entire dummy fin 51.

During ion doping 80 on the entire dummy fin 51, an ion doping concentration in the dummy fin 51 should be neither excessively low nor excessively high. If the ion doping concentration in the dummy fin 51 is excessively low, the ion doping 80 cannot significantly increase the etching selection ratio of the dummy fin 51 to the device fin 50. If the ion doping concentration in the dummy fin 51 is excessively high, an ion is more likely to be doped into the adjacent device fin 50. In this case, in some implementations, ion doping 80 is performed on the entire dummy fin 51, the ion doping concentration in the dummy fin 51 being 1.0E18 atom/cm$^3$ to 1.0E22 atom/cm$^3$.

In some implementations, a process for performing ion doping 80 on the entire dummy fin 51 includes an ion injection process. A parameter of the ion injection process includes: an injection energy of 10 KeV to 200 KeV and an injection angle of 0°.

In some implementations, ion doping 80 is performed on the entire dummy fin 51. Since the dummy fin 51 has a relatively large height, an injection energy of the ion injection process should avoid being excessively low, helping ensure that ions can be injected to the entire dummy fin 51, so that an ion doping depth in the dummy fin 51 is the height of the entire dummy fin 51. However, the injection energy of the ion injection process should also avoid being excessively high. During ion injection on the dummy fin 51, a shielding layer usually needs to be formed to cover the device fin 50. If the injection energy is excessively high, since the shielding layer is generally made of a relatively soft organic material, the shielding layer is likely to require an excessively large thickness to ensure that the shielding layer can effectively prevent ions from being injected into the device fin 50. To this end, in some implementations, the injection energy of the ion injection process is 10 KeV to 200 KeV.

In some implementations, an injection angle is 0°. The injection angle is an angle between an injection direction and a normal of a surface of the substrate 210. The injection angle is 0°, so that ions may be injected into the dummy fin 51 along a direction perpendicular to the surface of the substrate 210, helping reduce the probability of injecting ions into the device fin 50 adjacent to the dummy fin 51 and correspondingly helping improve process stability.

It should be further noted that, with reference to FIG. 19 to FIG. 20, in some implementations, in the step of the doping removal, before ion doping 80 is performed on the entire dummy fin 51 or a part of the dummy fin 51 in thickness, the method for forming the semiconductor structure further includes: forming a shielding layer 160 (shown in FIG. 20) to cover the device fin 50, the shielding layer 160 having an opening 70 (shown in FIG. 20) located above the dummy fin 51 and corresponding to a position of the dummy fin 51.

The shielding layer 160 is used as a mask for performing ion doping on the dummy fin 51, helping prevent ions from being doped into the device fin 50. In some implementations, the shielding layer 160 is made of spin on carbon. In other implementations, the shielding layer may also be made of other organic materials with good filling performance.

In the step of forming the shielding layer 160, the dummy fin 51 is exposed from the opening 70, or the hard mask layer 150 on the dummy fin 51 is exposed from the opening 70.

In some implementations, the dummy fin 51 is exposed from the opening 70. Therefore, performing ion doping on the dummy fin 51 at the bottom of the opening 70 helps reduce the difficulty of performing ion doping on the dummy fin 51.

The shielding layer 160 is used as a mask for performing ion doping on the dummy fin 51. The shielding layer 160 is further configured to protect the device fin 50. Therefore, during formation of the shielding layer 160, a thickness of the shielding layer 160 located on the device fin 50 should not be excessively small. Otherwise, an effect of blocking ion injection by the shielding layer 160 during ion doping on the dummy fin 51 is likely to be reduced, and a protection effect of the shielding layer 160 to the device fin 50 is likely to be reduced. The shielding layer 160 is removed subsequently. The thickness of the shielding layer 160 located on the device fin 50 should also not be excessively large, Otherwise, difficulty in and a time spent for subsequently removing the shielding layer 160 are likely to be increased. In some implementations, the thickness of the shielding layer 160 is 500 Å to 2000 Å.

In an actual process, the thickness of the shielding layer 160 may be properly adjusted according to an actual ion injection process parameter, such as ion injection energy, so as to ensure that the shielding layer 160 can provide sufficient protection for the device fin 50. The thickness of the shielding layer 160 is not limited to the above range in the present disclosure.

In some implementations, the process of forming the shielding layer 160 includes the following steps: As shown in FIG. 19, a flat layer 121 covering the device fin 50 and the dummy fin 51, a second anti-reflection coating layer 122 located on the flat layer 121, and a second pattern layer 123 located on the second anti-reflection coating layer 122 are formed on the base 100. The second pattern layer 123 has a pattern opening 60 from which the second anti-reflection coating layer 122 located above the dummy fin 51 is exposed. As shown in FIG. 20, the second anti-reflection coating layer 122 and the flat layer 121 are sequentially etched along the pattern opening 60 using the second pattern layer 123 as a mask to form an opening 70 is formed in the flat layer 121. A remaining flat layer 121 is used as the shielding layer 160.

In some implementations, during formation of the second pattern layer 123, a position of the pattern opening 60 in the second pattern layer 123 corresponds to a position of dummy fin set 90. Compared to a fact that the pattern opening corresponds to a single dummy fin, the pattern opening 60 formed in some implementations has a relatively large dimension. The second pattern layer 123 and the pattern opening 60 are formed using a photolithography process. Therefore, a process window of the photolithography process is relatively large.

For related descriptions of the second anti-reflection coating layer 122 and the second pattern layer 123, reference may be made to the foregoing detailed descriptions of the first anti-reflection coating layer 112 (shown in FIG. 16) and the first pattern layer 113 (shown in FIG. 16), respectively, and details are not described herein again in some implementations.

In some implementations, a drying etching process is used. For example, the second anti-reflection coating layer 122 and the flat layer 121 are sequentially etched using an anisotropic dry etching process.

In some implementations, the dummy fin 51 is exposed from the opening 70. Specifically, the top of the dummy fin 51 is exposed from the opening 70. Therefore, during formation of the opening 70, the flat layer 121 is etched by a relatively small depth without removing the dummy fin 51 through etching, and a required etching time is correspondingly relatively short, helping reduce a probability of exposing the adjacent device fin 50 from the opening 70. In addition, the opening 70 is formed through etching of the flat layer 121 along the pattern opening 60, helping reduce a requirement on overlay shift during formation of the pattern opening 60, thereby increasing a process tolerance and a process window.

Therefore, in the step of forming the opening 70, after the second anti-reflection coating layer 122 and the flat layer 121 are sequentially etched using the second pattern layer 123 as a mask, the hard mask layer 150 located on the dummy fin 51 is further removed through etching. Specifically, the pad oxide layer 110, the polishing stop layer 120, and the hard mask layer 150 that are located on the dummy fin 51 are removed through etching to expose the dummy fin 51.

In some implementations, in the step of removing the hard mask layer 150 located on the dummy fin 51, an etching selection ratio of the hard mask layer 150 to the shielding layer 160 is at least 5:1, so that a probability of mis-etching the shielding layer 160 is reduced, thereby helping prevent the adjacent device fin 50 or the hard mask layer 150 on the adjacent device fin 50 from being exposed from the opening 70, correspondingly helping reduce a probability of doping ions into the device fin 50 during subsequent ion doping on the dummy fin 51.

In an example, in the step of removing the hard mask layer 150 located on the dummy fin 51, the etching selection ratio of the hard mask layer 150 to the device fin 50 is at least 5:1. The relatively high etching selection ratio of the hard mask layer 150 to the device fin 50 helps significantly reduce the probability of mis-etching the device fin 50.

In some implementations, during formation of the opening 70, the second pattern layer 123 and the second anti-reflection coating layer 122 are gradually consumed. After the opening 70 is formed, the second pattern layer 123 and the second anti-reflection coating 122 are already removed.

In some implementations, that the dummy fin 51 is exposed from the opening 70 is used as an example. In other implementations, only the hard mask layer on the dummy fin may also be exposed from the opening. In some implementations, the opening has a relatively small depth. During etching of the flat layer to form the opening, the flat layer is etched by a smaller depth, and a depth-to-width ratio of the opening is also relatively small, helping reduce difficulty of the process for forming the opening. Correspondingly, during ion doping on the entire dummy fin or a part of the dummy fin in thickness, the injection energy of the ion injection process may be appropriately adjusted so that the ions can be injected into the dummy fin through the hard mask layer using the ion injection process.

Figure 22:
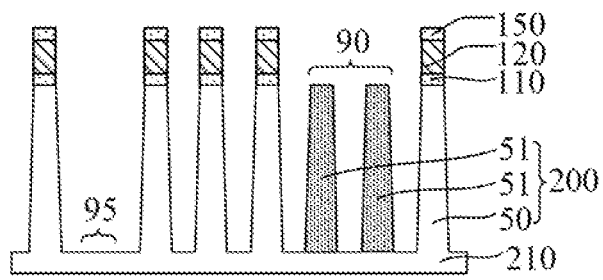

With reference to FIG. 22, in some implementations, the step of the doping removal further includes: after ion doping 80 is performed on the entire dummy fin 51 or a part of the dummy fin 51 in thickness, removing the shielding layer 160.

In some implementations, that a wet etching process is used for subsequently removing the ion-doped dummy fin 51 is used as an example. The shielding layer 160 is generally made of an organic material. Before the ion-doped dummy fin 51 is removed, the shielding layer 160 is removed, helping prevent the shielding layer 160 from causing pollution to a machine of the subsequent wet etching process, thereby helping improve process compatibility. Moreover, removing the shielding layer 160 may further expose a sidewall of the dummy fin 51, helping increase a contact area between an etching solution of the wet etching process and the dummy fin 51, thereby helping completely remove the dummy fin 51 and reducing a probability that the dummy fin 51 remains.

In some implementations, the shielding layer 160 is removed using an ashing process.

In other implementations, according to actual process requirements, the shielding layer may also be removed after the ion-doped dummy fin is removed. For example, during subsequent removal of the ion-doped dummy fin using a plasma etching process, the shielding layer may be further used as an etching mask for the plasma etching process, helping reduce the probability of mis-etching the device fin and improve process integration.

Figure 23:
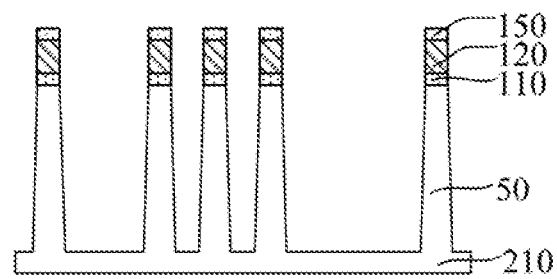

As shown in FIG. 23, the ion-doped dummy fin 51 (shown in FIG. 22) is removed.

In some implementations, that ion doping performed on the entire dummy fin 51 is used as an example. Therefore, the entire ion-doped dummy fin 51 is removed.

In the step of removing the ion-doped dummy fin 51, the etching selection ratio of the dummy fin 51 to the device fin 50 is at least 10:1. Since the etching selection ratio of the dummy fin 51 to the device fin 50 is relatively high, a probability of causing damage to the device fin 50 is relatively low, helping increase a process window for removing the ion-doped dummy fin 51.

In some implementations, the ion-doped dummy fin 51 is removed using a wet etching process. The wet etching process is likely to achieve a large etching selection ratio, and operation of the wet etching process is simple and process costs are low. Moreover, the wet etching process has an isotropic etching characteristic, with which the dummy fin 51 can be completely removed easily.

Specifically, in some implementations of the present disclosure, after the shielding layer 160 is removed, the ion-doped dummy fin 51 is removed using the wet etching process, so that an etching solution is in contact with the top surface and the sidewall of the dummy fin 51, helping completely remove the dummy fin 51, thereby helping reduce the probability that the dummy fin 51 remains.

In other implementations, the ion-doped dummy fin may also be removed using a plasma etching process. Using the plasma etching process helps perform the ion injection process and the plasma etching processes in a same plasma device, helping simplify process steps and improve process integration.

In some implementations, the etching solution in the wet etching process includes an HNA solution. The HNA solution is to a mixed solution of hydrofluoric acid, nitric acid, and acetic acid. Compared to a rate of etching ion-doped silicon using the HNA solution, a rate of etching the ion-doped silicon using the HNA solution is higher. Using the HNA solution helps improve an etching selection ratio of the ion-doped dummy fin 51 to the device fin 50 in the wet etching process, thereby significantly reducing the probability of causing damage to the device fin 50.

In an example, a parameter of the wet etching process includes the following: a volume ratio of hydrofluoric acid, nitric acid to acetic acid in the mixed solution of hydrofluoric acid, nitric acid, and acetic acid is 1:1:1 to 1:4:8. Setting the volume ratio of hydrofluoric acid, nitric acid to acetic acid to the above range ensures that there is a relatively large etching selection ratio between the ion-doped dummy fin 51 and the device fin 50 when the HNA solution is used.

It should be noted that, in an actual process, the volume ratio of hydrofluoric acid, nitric acid to acetic acid is set to the above range, and volume ratios of the three acids (hydrofluoric acid, nitric acid, and acetic acid) to water may be further adjusted so adjust a rate of etching the ion-doped dummy fin 51 using the HNA solution. The volume ratios of the three acids to water are not limited in the present disclosure.

During an actual wet etching process, the etching solution may also be oscillated. For example, the dummy fin 51 is etched using an ultrasonic etching solution, helping increase the rate of etching the dummy fin 51.

A subsequent step generally further includes: removing the pad oxide layer 110, the polishing stop layer 120, and the hard mask layer 150. Steps of the subsequent process are not described in detail herein again in some implementations.

Additional forms of the method for forming a semiconductor structure of the present disclosure are further provided. Similarities between the implementations described below and the embodiments and implementations described above are not described herein again. Some implementations described below are different from the foregoing embodiments and implementations in that the step of removing the dummy fin includes performing doping removal a plurality of times. Correspondingly, the doping removal includes: performing ion doping on a part of the dummy fin in thickness; and removing the ion-doped dummy fin.

In some implementations, the doping processing is repeated a plurality of times until the dummy fin is completely removed.

In some implementations, during each doping process, ion doping is performed on only a part of the dummy fin in thickness, that is, a doping depth of each ion doping is merely a part of a height of the dummy fin, helping reduce the difficulty of performing ion doping on the dummy fin.

For detailed descriptions of the method for forming a semiconductor structure in the present implementations, reference may be made to the corresponding descriptions in the foregoing embodiments and implementations, as the details are not described again.

The present disclosure further provides a semiconductor structure. FIG. 22 shows a schematic structural diagram of one form of a semiconductor structure according to the present disclosure.

The semiconductor structure includes: a substrate 210; discrete fins 200 located on the substrate 210 and including a device fin 50 and a dummy fin 51, where the dummy 51 fin has a doped ion therein, the doped ion being suitable for improving an etching selection ratio of the dummy fin 51 to the device fin 50.

The device fin 50 is configured to form a semiconductor device. Specifically, the device fin 50 is configured to provide a conductive channel for operation of a device. The dummy fin 51 is a to-be-removed fin 200. Subsequent removal of the dummy fin 51 helps form different types of pitches among the device fins 50.

In the semiconductor structure provided in the present implementations of the present disclosure, the dummy fin 51 further includes a doped ion. The doped ion is suitable for improving the etching selection ratio of the dummy fin 51 to the device fin 50. The dummy fin 51 is subsequently removed. Therefore, further doping the dummy fin 51 with the doped ion facilitates a relatively large etching selection ratio of the dummy fin 51 to the device fin 50 in the subsequently process for removing the dummy fin 51, thereby helping reduce the probability of mis-etching the device fin 50, increasing the process window of the fin cut process and improving the performance of the semiconductor structure.

The substrate 210 is configured to provide a process platform for subsequently forming a semiconductor structure.

In some implementations, the substrate 210 is made of silicon.

In some implementations, fin 200 and the substrate 210 are an integrated structure.

In some implementations, the fin 200 is made of a material same as that of the substrate 210, and the fin 200 is made of silicon.

In some implementations, a doped ion in the dummy fin 51 includes an argon ion, a boron ion, or an arsenic ion.

Doping the argon ion into the material of the dummy fin 51 helps increase a roughness and a porosity of the material of the ion-doped dummy fin 51, so that a density and a hardness of the material of the dummy fin 51 are relatively small. Therefore, the dummy fin 51 doped with the argon ion is more easily removed, thereby correspondingly improving the etching selection ratio of the dummy fin 51 to the device fin 50. Compared to silicon, boron or arsenic has a smaller atomic radius. Doping the boron ion or the arsenic ion into the dummy fin 51 can generate a tensile stress in a lattice structure of silicon, forming malposition in the material of the dummy fin 51, so that the ion-doped dummy fin 51 is more easily removed, thereby improving the etching selection ratio of the dummy fin 51 to the device fin 50.

In some other implementations, the dummy fins may also be doped with other suitable ions to improve the etching selection ratio of the dummy fin to the device fin. No limitation is imposed on this in the present disclosure.

In some implementations, the ion doping depth in the dummy fin 51 is the entire height of the dummy fin 51.

The ion doping concentration in the dummy fin 51 should not be excessively small. Otherwise, the ion doping cannot significantly increase the etching selection ratio of the dummy fin 51 to the device fin 50. The ion doping concentration in the dummy fin 51 should not be excessively large. Otherwise, an ion is more likely to be doped into the adjacent device fin 50. In this case, in some implementations, the ion doping concentration in the dummy fin 51 is the entire height of the dummy fin 51, which is $1.0E18$ $atom/cm^3$ to $1.0E22$ $atom/cm^3$.

In some implementations, a position of the dummy fin 51 corresponds to a fin cut position. There is a plurality of dummy fins 51, where the dummy fins of the plurality of the dummy fins 51 are adjacent to each other to form a dummy fin set 90.

In some implementations, that the dummy fin set 90 has two adjacent dummy fins 51 is used as an example. In other implementations, there may be more than two dummy fins in the dummy fin set.

In some implementations, the plurality of dummy fins 51 in the dummy fin set 90 are doped with ions, that is, the plurality of dummy fins 51 in the dummy fin set 90 are removed in a step of a subsequent process. Compared to the solution of removing the first dummy spacer for forming the dummy fin set 90 in the previous process, the dummy fin set 90 having a plurality of adjacent dummy fins 51 is subsequently removed using a fin cut last process in the present disclosure, helping improve dimension uniformity and cross-sectional profile uniformity of the fin 200.

Moreover, in some implementations, the plurality of dummy fins 51 in the dummy fin set 90 are doped with ions, helping reduce the difficulty of performing ion doping on the dummy fin 51 compared to doping of ions into a single dummy fin.

In some implementations, the substrate 210 further includes an interval 95 isolated from the dummy fin set 90 and corresponding to a single fin cut position, that is, there is an interval 95 corresponding to the single fin cut position between the two device fins 50 located on two sides of the interval 95. The reason why the substrate 210 has the interval 95 is as follows. The second dummy spacer corresponding to the single fin cut position is removed before the fin 200 is formed, and the second dummy spacer correspondingly consists of a single spacer. Removing the second dummy spacer consisting of a single spacer before the fin 200 is formed helps reduce impact on pitch uniformity between remaining spacers, correspondingly helping improve the dimension uniformity and cross-sectional profile uniformity of the fin 200. Moreover, a height of the spacer is less than the height of the fin 200, removing a single spacer is less difficult in process compared to removal of a single fin 200, helping reduce the difficulty of fin cut process.

In some implementations, the semiconductor structure further includes: a pad oxide layer 110 located on the top of the device fin 50; a polishing stop layer 120 located on the pad oxide layer 110; and a hard mask layer 150 located on the polishing stop layer 120.

The pad oxide layer 110 is configured to provide a buffering effect for the polishing stop layer 120, helping avoid malposition generated when the polishing stop layer 120 is located on the device fin 50. In some implementations, the pad oxide layer 110 is made of silicon oxide.

After the dummy fin 51 is removed, a step of a subsequent process generally further includes: forming an isolation structure on the substrate 210 exposed from the device fin 50. A process for forming the isolation structure generally includes a polishing process. The polishing stop layer 120 is configured to define a position at which the polishing process is stopped.

In some implementations, the polishing stop layer 120 is made of silicon nitride.

The fin 200 is formed through patterning of the base using the spacer as a mask, and a hard mask layer 150 is disposed. During patterning of the base, a pattern of the spacer may be first transferred to the hard mask layer 150. Even if the spacer has a loss during patterning of the base, the hard mask layer 150 may still be used as a mask to etch the base, helping improve process stability and a process effect of subsequent patterning of the base.

In some implementations, the hard mask layer 150 is made of silicon oxide.

The semiconductor structure may be formed using forming method in the foregoing embodiments and implementations, or may be formed using other forming methods. For detailed descriptions of the semiconductor structure in the present implementations, reference may be made to the corresponding descriptions in the foregoing embodiments and implementations, and details are not described herein again in some implementations.

Although the present disclosure is disclosed as above, the present disclosure is not limited thereto. A person skilled in the art may make variations and modifications without departing from the spirit and scope of the present disclosure. Therefore, the protection scope of the present disclosure should be subject to the claims.

What is claimed is:

1. A method for forming a semiconductor structure, comprising:
providing a base;
forming a discrete core layer on the base;

forming a spacer on a sidewall of the core layer;
removing the core layer;
after the core layer is removed, patterning the base using the spacer as a mask to form a fin, where the fin comprises a device fin and a dummy fin;
removing the spacer; and
performing doping removal on the dummy fin one or more times, removing the dummy fin, where the step of the doping removal comprises:
    forming a shielding layer to cover the device fin, the shielding layer having an opening located above the dummy fin and corresponding to a position of the dummy fin;
    after forming the shielding layer, performing ion doping on the entire dummy fin or a part of the dummy fin in thickness for improving an etching selection ratio of the dummy fin to the device fin;
    removing the shielding layer; and
    after removing the shielding layer, removing the ion-doped dummy fin.

2. The method for forming a semiconductor structure according to claim 1, wherein:
    in the step of forming the spacer, the spacer is used as a mask for patterning the base to form the fin, and a position of the spacer corresponds to a position of the fin, wherein a spacer for forming the device fin is a mask spacer, and a spacer for forming the dummy fin is a dummy mask spacer, where the dummy mask spacer comprises a first dummy spacer consisting of a plurality of adjacent spacers and a second dummy spacer consisting of a single spacer;
    after the core layer is removed and before the base is patterned, the method for forming a semiconductor structure further comprises: removing the second dummy spacer; and
    during patterning of the base, the base is patterned using the spacer as a mask, the device fin is formed at a position corresponding to a position of the mask spacer, and the dummy fin is formed at positions corresponding to positions of a plurality of dummy mask spacers in the first dummy spacer.

3. The method for forming a semiconductor structure according to claim 1, wherein in the step of performing ion doping on the entire dummy fin or a part of the dummy fin in thickness, doped ions comprise argon ions, boron ions, or arsenic ions.

4. The method for forming a semiconductor structure according to claim 1, wherein the step of removing the dummy fin comprises:
    performing doping removal once, the doping removal comprising:
        performing ion doping on the entire dummy fin; and
        removing the ion-doped dummy fin.

5. The method for forming a semiconductor structure according to claim 4, wherein in the step of performing ion doping on the entire dummy fin, an ion doping concentration in the dummy fin is $1.0E18$ atom/cm$^3$ to $1.0E22$ atom/cm$^3$.

6. The method for forming a semiconductor structure according to claim 4, wherein a process for performing ion doping on the entire dummy fin comprises an ion injection process.

7. The method for forming a semiconductor structure according to claim 6, wherein a parameter of the ion injection process comprises: an injection energy of 10 KeV to 200 KeV and an injection angle of 0°.

8. The method for forming a semiconductor structure according to claim 1, wherein:
    during patterning of the base, a hard mask layer is further formed on the top of the fin; and
    in the step of forming the shielding layer, the dummy fin is exposed from the opening, or the hard mask layer on the dummy fin is exposed from the opening.

9. The method for forming a semiconductor structure according to claim 1, wherein in the step of forming the shielding layer, a thickness of the shielding layer on the device fin is 500 Å to 2000 Å.

10. The method for forming a semiconductor structure according to claim 1, wherein in the step of removing the ion-doped dummy fin, the etching selection ratio of the dummy fin to the device fin is at least 10:1.

11. The method for forming a semiconductor structure according to claim 1, wherein a process for removing the ion-doped dummy fin comprises a wet etching process or a plasma etching process.

12. The method for forming a semiconductor structure according to claim 11, wherein the ion-doped dummy fin is removed using a wet etching process, where an etching solution in the wet etching process comprises a mixed solution of hydrofluoric acid, nitric acid, and acetic acid.

13. The method for forming a semiconductor structure according to claim 12, wherein a parameter of the wet etching process comprises:
    a volume ratio of hydrofluoric acid, nitric acid to acetic acid in the mixed solution of hydrofluoric acid, nitric acid, and acetic acid is 1:1:1 to 1:4:8.

* * * * *